United States Patent [19]

Turner

[11] Patent Number: 5,119,167
[45] Date of Patent: Jun. 2, 1992

US005119167A

[54] METHOD OF IMPROVING THE CORROSION RESISTANCE OF ALUMINUM CONTACTS ON SEMICONDUCTORS

[75] Inventor: Timothy E. Turner, Roanoke, Tex.

[73] Assignee: SGA-Thomson Microelectronics, Inc., Carrollton, Tex.

[21] Appl. No.: 261,175

[22] Filed: Oct. 21, 1988

Related U.S. Application Data

[62] Division of Ser. No. 65,344, Jun. 23, 1987, Pat. No. 4,818,727.

[51] Int. Cl.⁵ ............... H01L 23/48; H01L 23/54
[52] U.S. Cl. ........................................ 357/67; 357/70
[58] Field of Search ............... 357/67, 70; 204/38.4, 204/38.1

[56] References Cited

U.S. PATENT DOCUMENTS

| | | | |
|---|---|---|---|
| 2,695,876 | 11/1954 | Fariss | 422/19 |
| 2,816,850 | 12/1957 | Haring | 148/33 |
| 2,989,424 | 6/1961 | Angello | 357/52 |
| 3,191,401 | 6/1965 | Beyer et al. | 62/280 |
| 3,535,168 | 10/1970 | Thompson | |
| 4,003,760 | 1/1977 | Labenski et al. | 204/38.4 |
| 4,135,292 | 1/1979 | Jaffe et al. | 437/24 |
| 4,183,758 | 1/1980 | Schiffman | 106/14.21 |
| 4,341,564 | 7/1982 | Schiffman | 106/14.21 |
| 4,387,006 | 6/1983 | Kajiwara et al. | |
| 4,572,928 | 2/1986 | Waliby | 29/827 |
| 4,597,714 | 7/1986 | Morrison et al. | 274/116 |
| 4,614,963 | 9/1986 | Brettle et al. | 357/72 |
| 4,627,151 | 12/1986 | Mulholland et al. | 437/220 |
| 4,685,998 | 8/1987 | Quinn | 29/827 |
| 4,818,727 | 4/1989 | Turner | 437/209 |
| 4,845,543 | 7/1989 | Okikawa et al. | 357/70 |

FOREIGN PATENT DOCUMENTS

| | | |
|---|---|---|
| 58-174436 | 10/1983 | Japan . |
| 60-131975 | 7/1985 | Japan . |
| 0131975 | 7/1985 | Japan . |
| 1532230 | 11/1978 | United Kingdom . |

OTHER PUBLICATIONS

Kirk-Othmer, *Encyclopedia of Chemical Technology*, 2nd edition, John Wiley and Sons, Inc. 1964, pp. 506–516.

Primary Examiner—Rolf Hille
Assistant Examiner—S. V. Clark
Attorney, Agent, or Firm—Kenneth C. Hill; Lisa K. Jorgenson; Richard K. Robinson

[57] ABSTRACT

A method for improving the corrosion resistance of aluminum in a semiconductor device. The step includes providing a semiconductor device having aluminus containing contact pads; attaching a leadframe to the contact pads; and applying sufficient zinc chromate in solution to the contact pads for a sufficient time and at a sufficient temperature to render said aluminum substantially resistant to corrosion.

14 Claims, No Drawings

METHOD OF IMPROVING THE CORROSION RESISTANCE OF ALUMINUM CONTACTS ON SEMICONDUCTORS

This application is a division of application Ser. No. 07/065,344, filed Jun. 23, 1987 now U.S. Pat. No. 4,818,727.

BACKGROUND OF THE INVENTION

The present invention relates to semiconductor devices and more particularly to protective surface treatment of aluminum or aluminum alloy interconnection layers to avoid undesired corrosion. At this time, most semiconductor devices employ aluminum or aluminum alloy members as the conductive conduit on the chip circuit. Aluminum possesses several desired chemical and physical properties which make it an attractive choice for this use. These properties non-exclusively include low resistivity, ease of deposition onto semiconductor wafer components and good adhesion onto silicon dioxide. However, unfortunately, thin aluminum films are easily corroded in the presence of even small amounts of moisture and a small amount of an ionic species, especially chlorides. In order to prevent the corrosion of the aluminum interconnections on semiconductors, manufacturers usually apply a coating of glass or nitride over the top of the aluminum. This prevents the corrosion of the aluminum except for a small area necessary to connect the interconnect layer to the external package pins of the semiconductor. Unfortunately, this area is especially susceptible to corrosion. Moisture has been shown to travel along the interface between the package leads and the plastic packaging material directly to the exposed aluminum at the point of connection. This corrosion is the primary cause of failure for plastic packaged semiconductors in a moist environment.

Attempts by others to solve this problem require either an organic moisture barrier, or a multilayer metal process. Many organic coatings have been suggested as a moisture barrier including epoxies, silicones and parylene. None have been found to be effective. All show some moisture permeability through the material, and all allow migration between the package leads and the coating at their interface.

Multilayer metal treatments have been found to be an effective technique for preventing the corrosion of the aluminum. These techniques apply a thin barrier such as titanium or tungsten over the exposed aluminum, then coat this with a noble metal such as gold. The drawbacks to this technique include the expense of the complicated process of applying and patterning these additional layers. In addition, noble metals are susceptible to dendritic formation in moist environments. Dendritic formation may be as destructive to the microcircuit as aluminum corrosion. The present invention provides an improved process which renders such exposed aluminum much less susceptible to such corrosion. In this regard, the invention relates to the use of zinc chromate to passivate the surface of the aluminum which is exposed to a corrosive environment, especially at the contact pads of a semiconductor element. This zinc chromate treatment is applied to aluminum without the use of organic binders to hold the chromate to the aluminum surface.

SUMMARY OF THE INVENTION

The invention provides a method for producing a semiconductor article which comprises providing a semiconductor device having aluminum containing contact pads; electrically attaching a leadframe to said contact pads; and applying sufficient zinc chromate in solution to said contact pads for a sufficient time and at a sufficient temperature to render said aluminum substantially resistant to corrosion from an atmosphere containing moisture and an ionic species.

The invention also provides a method for producing an aluminum containing article having improved corrosion resistance which comprises providing an aluminum containing article and applying sufficient zinc chromate in solution to said article for a sufficient time and at a sufficient temperature to render said aluminum substantially resistant to corrosion from an atmosphere containing moisture and an ionic species.

DETAILED DESCRIPTION OF THE PREFERRED EMBODIMENT

As hereinbefore mentioned, the invention concerns the use of a zinc chromate solution to passivate the surface of aluminum which is exposed at the contact pads of the semiconductor device and render the same substantially corrosion resistant.

The zinc chromate is applied by the immersion of the semiconductor mounted on its leadframe in an aqueous solution of zinc chromate at 70 degrees centigrade. The semiconductor can be processed in strip form just prior to plastic encapsulation.

During the immersion zinc deposits from the solution onto the aluminum. Additionally, the chromate acts to build the self passivation layer of $Al_2O_3$ on the aluminum.

The zinc deposited on the surface of the aluminum will later corrode anodically to the aluminum in any corrosive atmosphere. By so doing, the zinc tends to plate out on the aluminum surface thus preventing further corrosion.

This is especially important for copper containing aluminum alloys. Copper containing alloys of aluminum are much more susceptible to corrosion because copper precipitants form on the surface of the material and prevent the formation of the self passivation oxide layer that allows the aluminum corrosion resistance.

The zinc chromate treatment is applied preferably in an aqueous solution containing from about 0.1% to about 20% zinc chromate by weight of the solution. In the most preferred embodiment the treatment is conducted in a saturated zinc chromate solution. Also in the preferred embodiment the application is conducted for from about 10 to about 60 minutes or more preferably at from about 15 to about 20 minutes at a solution temperature in the range of from about 50° C. to about 100° C. These conditions are not critical and can be readily adjusted by those skilled in the art depending upon the effect desired and the alloy employed. In general, the leadframe and chip are subsequently encapsulated in a plastic casing. The zinc chromate applied at this stage in the process presents few drawbacks. Experiments have been tried with immersion of wafers prior to the interconnection of the aluminum leadframe wires. At this point the zinc chromate treatment was found to prevent a good metallurgical bond. However, if the zinc chromate is applied following the wire bonding operation, this is not a problem.

The zinc chromate is found to deposit only on the aluminum. No residue is found on the top surface of the passivation glass. If leakage measurements are taken following a zinc chromate treatment, no interlead leakage is found.

One possible drawback to the instant invention may arise if the treatment is applied to leadframes which are to be coated with solder following plastic encapsulation. This drawback is caused by the deposition of zinc chromate on the surface of the leadframe. Unless care is taken, this residue can prevent the solder from sticking to the leadframe. However, if sufficiently active flux is used, this residue has no effect. An alternative solution to this potential problem is to clean the leadframe in a mildly acidic wash prior to the solder coating process.

The following non-limiting example serves to illustrate the invention.

EXAMPLE

A number of ceramic packaged samples of a 64k DRAM are built, but are not lidded. Some of these samples are immersed in a saturated solution of zinc chromate in water maintained at 70° C. for 20 minutes, while the rest serve as controls. In order to perform a test of the effect of this treatment, the cavity of each package is filled with normal tap water. A power supply is then connected to two adjacent package pins and a five volt potential applied between these two pins. The parts which had not been exposed to the zinc chromate treatment corrode to an open circuit condition within 30 seconds. The zinc chromated treatment samples last more than two hours, although some signs of corrosion are evident.

What is claimed is:

1. A semiconductor article produced by a method which comprises providing a semiconductor device having aluminum containing contact pads; electrically attaching a leadframe to said contact pads; and applying sufficient zinc chromate in solution to said contact pads for a sufficient time and at a sufficient temperature to render said aluminum substantially resistant to corrosion from an atmosphere containing moisture and an ionic species.

2. The article of claim 1 wherein said zinc chromate in solution comprises an aqueous solution containing from about 0.1% to about 20% zinc chromate based on the weight of the solution component parts.

3. The article of claim 1 wherein said zinc chromate in solution comprises a saturated solution of zinc chromate in water.

4. The article of claim 1 wherein said application is conducted wherein said solution is maintained at a temperature of from about 50° C. to bout 100°C.

5. The article of claim 1 wherein said application is conducted for from about 10 to about 60 minutes.

6. The article of claim 1 wherein said aluminum containing contact pad is an alloy containing at least about 90% by weight aluminum.

7. The article of claim 6 wherein said alloy contains from about 0.5% to about 7% by weight copper.

8. The article of claim 6 wherein said alloy contains from about 0.5% to about 1% by weight silicon.

9. The article of claim 1 wherein said zinc chromate in solution comprises an aqueous solution containing from about 0.1% to about 20% zinc chromate based on the weight of the solution component parts; and wherein said application is conducted wherein said solution is maintained at a temperature of from bout 50° C. to about 100° C.; and wherein said application is conducted for from about 10 to bout 60 minutes.

10. A semiconductor article which comprises a semiconductor device having aluminum containing contact pads and a leadframe having leads which are electrically attached to a portion of said contact pads, the portion of the contact pads not underlying said leads having a surface which is the reaction product of aluminum and zinc chromate.

11. The article of claim 10 wherein said leadframe comprises aluminum and the outer surface of said leadframe comprises the reaction product of aluminum and zinc chromate.

12. The article of claim 10 wherein said aluminum containing contact pads comprise an alloy containing at least abut 90% by weight aluminum.

13. The article of claim 12 wherein said alloy contains from about 0.5% to about 7% by weight copper.

14. The article of claim 12 wherein said alloy contains from about 0.5% to about 1% by weight silicon.

* * * * *